United States Patent
Giotta et al.

(10) Patent No.: US 8,791,755 B2
(45) Date of Patent: Jul. 29, 2014

(54) SELF-OSCILLATING DRIVER CIRCUIT

(75) Inventors: Dario Giotta, Travisio (IT); Thomas Poetscher, Villach (AT); David San Segundo Bello, Villach (AT); Andreas Wiesbauer, Poertschach (AT)

(73) Assignee: Lantiq Deutschland GmbH, Neubiberg (DE)

( * ) Notice: Subject to any disclaimer, the term of this patent is extended or adjusted under 35 U.S.C. 154(b) by 375 days.

(21) Appl. No.: 13/267,476

(22) Filed: Oct. 6, 2011

(65) Prior Publication Data

US 2012/0019317 A1  Jan. 26, 2012

Related U.S. Application Data

(63) Continuation of application No. 11/512,706, filed on Aug. 30, 2006, now Pat. No. 8,063,697.

(30) Foreign Application Priority Data

Aug. 30, 2005 (DE) .......................... 10 2005 041 052

(51) Int. Cl.
*H03F 3/38* (2006.01)
(52) U.S. Cl.
USPC ............. 330/10; 330/291; 330/303; 330/109; 331/17; 332/109
(58) Field of Classification Search
USPC ........ 330/10, 291, 303, 109; 331/17; 332/109
See application file for complete search history.

(56) References Cited

U.S. PATENT DOCUMENTS

| | | |
|---|---|---|
| 5,352,986 A | 10/1994 | Modgil et al. |
| 5,710,720 A | 1/1998 | Algrain et al. |
| 6,078,614 A | 6/2000 | Brown et al. |
| 6,509,796 B2 * | 1/2003 | Nguyen et al. ................ 330/254 |
| 6,870,928 B1 | 3/2005 | Conroy et al. |
| 7,839,211 B2 * | 11/2010 | Nielsen ........................... 330/10 |
| 8,049,557 B2 * | 11/2011 | Georges Putzeys ............ 330/10 |
| 2002/0118552 A1 | 8/2002 | Nakagawa |
| 2002/0158689 A1 | 10/2002 | Harris et al. |
| 2004/0095196 A1 | 5/2004 | Maxim et al. |
| 2004/0162047 A1 | 8/2004 | Kasahara et al. |
| 2005/0053227 A1 | 3/2005 | Fortier |
| 2005/0113034 A1 | 5/2005 | Mangino et al. |
| 2010/0327940 A1 * | 12/2010 | Eisenstadt et al. ........... 327/357 |

FOREIGN PATENT DOCUMENTS

WO  0027028 A1  5/2000

OTHER PUBLICATIONS

Non-Final Office Action Dated Feb. 4, 2010 for U.S. Appl. No. 11/512,706. 11 Pages.
Final Office Action Dated Jul. 20, 2010 for U.S. Appl. No. 11/512,706. 10 Pages.

(Continued)

*Primary Examiner* — Patricia Nguyen

(57) ABSTRACT

A self-oscillating driver circuit includes a driver stage, a feedforward path which is coupled to an input of the driver stage, and a feedback path which couples an output of the driver stage to an input of the feedforward path. The feedforward path includes a feedforward filter which is designed as an active filter. In order to prevent an oscillatory state of the driver circuit at an unwanted frequency, it is proposed that an internal state variable of the feedforward filter be monitored and that the feedforward filter be reset if the value of the monitored internal state variable is outside a predefined range.

20 Claims, 3 Drawing Sheets

(56) References Cited

OTHER PUBLICATIONS

Non-Final Office Action Dated Sep. 28, 2010, for U.S. Appl. No. 11/512,706. 9 Pages.
Non-Final Office Action Dated Mar. 1, 2011 for U.S. Appl. No. 11/512,706. 11 Pages.
Notice of Allowance Dated Jul. 13, 2011 for U.S. Appl. No. 11/512,706. 10 Pages.
Wong, Ngai and Tung-Sang ng. "Fast Detection of Instability in Sigma-Delta Modulatros Based on Unstable Embedded Limit Cycles." IEEE Transaction on Circuits and Systems—II: Express Briefs. vol. 51. No. 8. Aug. 2004. pp. 442-449. 8 Pages.
Piessens, Tim and Michael Steyaert. "A Central Office Combined ADSL-VDSL Line Driver Solution in. 35 um CMOS." IEEE 2002 Custom Integrated Circuits Conference. 2002. pp. 45-48. 4 Pages.

\* cited by examiner

SELF-OSCILLATING DRIVER CIRCUIT

RELATED APPLICATIONS

This application is a continuation application of U.S. application Ser. No. 11/512,706, filed Aug. 30, 2006, which claims priority to German Application No. DE 10 2005 041 052.9, filed Aug. 30, 2005.

FIELD OF INVENTION

The present invention relates to a driver circuit and a method for controlling the stability of a self-oscillating driver circuit.

BACKGROUND

In the case of line drivers, it is known to use so-called clocked or class D line drivers, which have, in particular, the advantage of a high efficiency, such that the power consumption of a communications facility using the driver circuit can be reduced. The basic principle of a clocked line driver circuit is based on first converting an analog input signal of the driver circuit into a pulse-width modulated signal which can then be amplified in a particularly efficient manner. Lowpass filtering is then used to obtain the amplified output signal of the driver circuit from the amplified pulse-width modulated signal. One requirement for performing the pulse-width modulation is an appropriate clock signal, on which the pulse-width modulation is based. The clock signal can be supplied by means of, for example, an external oscillator.

A further possibility for generating the clock signal consists in providing the driver circuit with a feedback loop, which connects an output of the driver circuit to an input of a feedforward path of the driver circuit such that there is formed, via the feedback path and the feedforward path, a closed loop which renders possible an oscillating behaviour of the driver circuit itself. Furthermore, a feedforward filter in the feedforward path and a feedback filter in the feedback path typically ensure a sufficient linearity of the signal transmission.

In the case of more exacting linearity requirements, such as those that exist, for example, for DSL communications applications with higher data transmission rates, it is however advantageous to use higher-order active filters as feedforward filters. In this case, the driver circuit may exhibit an oscillatory behaviour at different frequencies, of which the only one frequency concerned is the frequency desired for the operation of the driver circuit. Furthermore, the available parameter range for the desired oscillatory behaviour of the driver circuit is reduced by production variations or changes in the external environment.

In view of the above, it would be advantageous to provide a self-oscillating driver circuit that may be controlled in such a way that oscillatory behaviour of the driver circuit at unwanted frequencies is prevented in an effective manner.

SUMMARY

A self oscillating driver circuit is disclosed herein. In one embodiment, the self oscillating driver circuit comprises a driver stage including an input and an output. A feedforward path including an active feedforward filter is coupled to the input of the driver stage. Furthermore, a feedback path couples the output of the driver stage to an input of the feedforward path. A control circuit is configured to generate a control signal in dependence on a monitoring signal derived from an internal state variable of the feedforward filter. The control signal is generated if the value of an internal state variable of the feedforward filter is outside a predefined range. The feedforward filter is configured to be reset through the control signal.

In one embodiment, the feedforward filter of the driver circuit comprises at least one integrator having at least one capacitive component of the at least one integrator. In addition, the driver circuit comprises a switching component driven through the control signal and bypassing the capacitive component. The control circuit generates the control signal in such a way that the switching component is temporarily closed if the value of the internal state variable is outside the predefined range.

Similarly, a method for controlling the stability of a self-oscillating driver circuit comprises providing the driver circuit including a driver stage, a feedforward path including a feedforward filter coupled to an input of the driver stage, and a feedback path which couples an output of the driver stage to an input of the feedforward path. The method further comprises monitoring an internal state variable of the feedforward filter. The step of monitoring the internal state variable of the feedforward filter may comprise comparing the value of the internal state variable with a threshold value. If the internal state variable of the feedforward filter is outside a predefined range, the feedforward filter is reset.

In one embodiment, the feedforward filter comprises at least one integrator, and the internal state variable is derived from a voltage at an output of the at least one integrator. In addition, the step of resetting the feedforward filter may comprise resetting the at least one integrator.

The above described features and advantages, as well as others, will become more readily apparent to those of ordinary skill in the art by reference to the following detailed description and accompanying drawings.

DESCRIPTION

Figure 1:
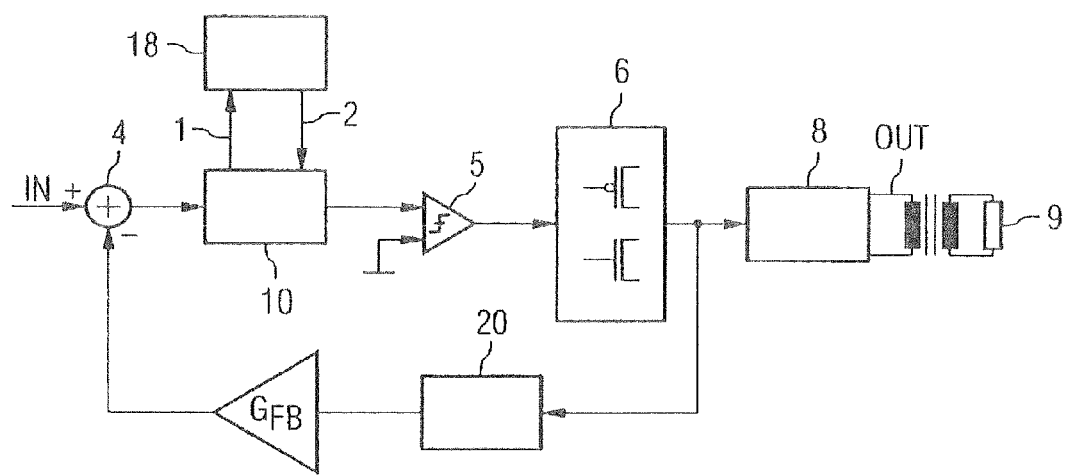
FIG. 1 shows a self-oscillating driver circuit according to an exemplary embodiment of the invention.

In the following, embodiments of the present invention will be explained in more detail with reference to the accompanying drawings.

For explaining a stability-control method according to an embodiment of the invention, a self-oscillating driver circuit is considered which has a driver stage, a feedforward path which is coupled to an input of the driver stage, and a feedback path which couples an output of the driver stage to an input of the feedforward path. The driver stage serves to amplify the signal. In order to render possible an oscillatory behaviour of the driver circuit and to ensure a sufficient linearity, the feedforward path comprises a feedforward filter, which is designed as an active filter. The feedback path may comprise, for example, a passive feedback filter.

According to the embodiment, it is proposed that an internal state variable of the feedforward filter be monitored. If the value of the internal state variable is outside a predefined range, this causes the feedforward filter to be reset. The resetting of the feedforward filter may be effected through resetting of an integrator of the feedforward filter. In this case, in particular, a capacitive element of the integrator, e.g. a capacitor, may be temporarily bypassed.

Through these measures, an oscillatory state of the driver circuit at an unwanted frequency is detected, and disrupted through resetting of the feedforward filter, such that a new transient effect is initiated. Because of the general design of the driver circuit, which is designed for an oscillatory state at the desired frequency, there is an increased probability of the new transient being effected at the desired frequency. Defective transients, which may occur with a certain probability because of production variations or changes in the external conditions, therefore do not result in an operation of the driver circuit at an unwanted frequency.

As an internal state variable of the feedforward filter, a quantity may be selected, which reacts with high sensitivity to an oscillatory state of the driver circuit at an unwanted frequency. For example, it is possible to select a quantity which has a small value in the case of an oscillatory state at the desired frequency, while having a large value in the case of an oscillatory state at an unwanted frequency. The oscillatory state at the unwanted frequency can then be reliably identified by comparing the value of the internal state variable with a predefined threshold value. It has been found that, in the case of an active filter comprising at least one integrator, an internal state variable that is suitable for monitoring can be derived from a voltage at an output of the integrator.

A self-oscillating driver circuit according to an embodiment of the invention comprises a feedforward path which is coupled to an input of the driver stage, and a feedback path which couples an output of the driver stage to an input of the feedforward path. The feedforward path comprises a feedforward filter which is designed as an active filter. According to an embodiment, the feedforward filter is a higher-order active filter, such that a high linearity of the driver circuit can be ensured.

The driver circuit comprises a control circuit which generates a control signal, in dependence on a monitoring signal derived from an internal state variable of the feedforward filter, if the value of the internal state variable of the feedforward filter is outside a predefined range. The feedforward filter can be reset through the control signal, such that, if it is detected by means of the monitoring signal that the internal state variable is outside the predefined range, and that the driver circuit is thus oscillating at an unwanted frequency, the feedforward filter is reset and a new transient is thereby effected.

In order to render possible a resetting of the feedforward filter, the latter comprises at least one integrator, of which a capacitive component, e.g. a capacitor, can be bypassed by means of a switching means, this switching means being driven through the control signal generated by the control circuit. Through temporary closing of the switching means, the instantaneous oscillatory state of the driver circuit can thus be disrupted in a simple manner, and a new transient can be effected.

FIG. 1 shows a self-oscillating driver circuit which is suitable, in particular, for use as a line driver circuit in a DSL communications device.

The driver circuit comprises a driver stage which, in the present case, is constituted by a comparator 5 and an inverter circuit 6. The comparator 5 effects a pre-amplification, while the inverter circuit 6 effects a final amplification. An input of the driver stage, i.e. an input of the comparator 5, is connected to a feedforward path which includes, in particular, a feedforward filter 10. The other input of the comparator 5 is connected to a fixed potential. The driver circuit furthermore comprises a feedback path which couples an output of the driver stage, i.e. an output of the inverter circuit 6, negatively in the summing nodal point 4, to an input of the feedforward path. The feedback path comprises, in particular, a feedback filter 20 which is designed as a passive filter. A feedback factor of the feedback path is represented by $G_{FB}$. The gain of the feedback path is typically less than one, i.e. it is actually an attenuation factor. In the summing nodal point 4, the signal of the feedback path is subtracted from an input signal IN of the driver circuit.

In order to ensure a sufficient linearity of the signal transmission by the driver circuit and to render possible a self-oscillating behaviour of the driver circuit, the feedforward filter 10 is designed as a higher-order active filter. The description that follows is based on a third-order filter, although other higher-order filters may be used, depending on the requirements in respect of linearity.

Because of the structure described above, signals in the closed loop of the driver circuit have an oscillatory behaviour. This has the effect that the analog input signal IN of the driver circuit is converted into an amplified signal of a pulse-width modulated type at the output of the driver stage, the underlying frequency of the pulse-width modulated signal being determined by the oscillation frequency of the driver circuit.

By means of a lowpass filter 8, high-frequency components are filtered out of the output signal of the driver stage, such that there is obtained an amplified analog output signal OUT, which is based on the input signal IN and which is injected into a transmission line 9. The lowpass filter 8 is designed, in particular, to filter the oscillation frequency of the self-oscillating driver circuit out of the output signal of the driver stage.

Whilst the driver circuit, i.e. the driver stage and the feedforward and feedback paths, is typically disposed on a DSL communications semiconductor module, the lowpass filter 8 is normally an external component.

The driver circuit represented in FIG. 1 furthermore comprises a control circuit 18 which picks up a monitoring signal 1 from the feedforward filter 10 and, in dependence on the monitoring signal 1, generates a control signal 2 which is supplied to the feedforward filter 10.

The monitoring signal 1 is derived from an internal state variable, of the feedforward filter 10, and is used to detect whether the driver circuit is oscillating at an unwanted frequency. An oscillatory state of the driver circuit at an unwanted circuit is exhibited in a deviant value of the internal state variables of the feedforward filter 10. If it is identified, by means of the monitoring signal 1, that the monitored internal state variable is outside a predefined range, the control circuit 18 therefore generates a control signal 2 which causes the feedforward filter 10 to be reset. For this purpose, the control circuit 18 may comprise, for example, a comparator which compares the value of the monitoring signal 1 or the value of the internal state variable with a predefined threshold value. Depending on the requirement, the control signal 2 may be generated when the value of the internal state variable exceeds the threshold value or when the value of the internal state variable falls below the threshold value. Furthermore, a comparison with both an upper and a lower threshold value is also conceivable, such that there is defined an allowable-range for the value of the internal state variable.

A resetting of the feedforward filter 10 disrupts the instantaneous oscillatory state of the driver circuit, and thereby results in a new transient which has an increased probability of resulting in an oscillatory state at the desired frequency. It is thereby ensured with high reliability that the driver circuit oscillates only at the desired frequency and not at other frequencies at which a stable oscillatory state would likewise be possible.

The structure of the feedforward filter is to be described more fully in the following, said feedforward filter ensuring both monitoring of an internal state variable and resetting by means of the control signal 2.

Figure 2:
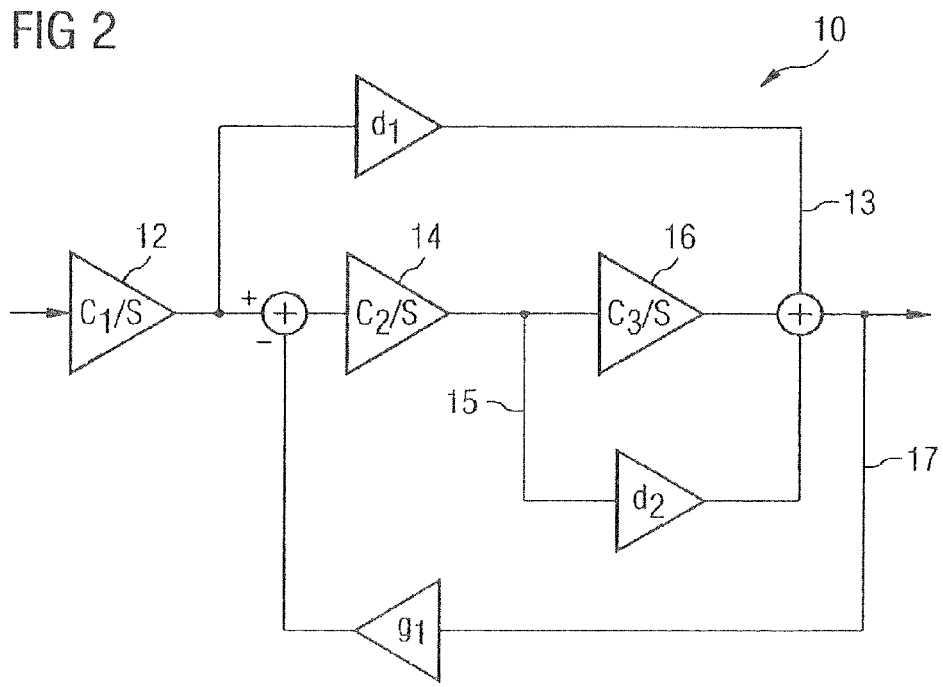
FIG. 2 shows, in schematic form, a third-order active filter which can be used as a feedforward filter in the case of the driver circuit of FIG. 1.

FIG. 2 shows, in schematic form, the structure of an active filter which can be used as the feedforward filter 10 of the driver circuit of FIG. 1. Said filter is a third-order filter, i.e. a first integrator 12, a second integrator 14 and a third integrator 16, connected substantially in series, are provided. The integrators 12, 14 and 16 have integration coefficients which are denoted by $c_1/s$, $c_2/s$ and $c_3/s$ respectively.

Additionally provided are a feedforward loop 13, by which an output signal of the first integrator 12 is positively coupled to a signal output of the third integrator 16, and a feedforward loop 15, by which an output signal of the second integrator 14 is positively coupled to the signal output of the third integrator 16. A feedback loop 17 negatively couples an output signal of the filter to a signal input of the second integrator 14. The feedforward loops 13 and 15 have feedforward coefficients $d_1$ and $d_2$ respectively. The feedback loop 17 has a feedback coefficient $g_1$.

Figure 3:
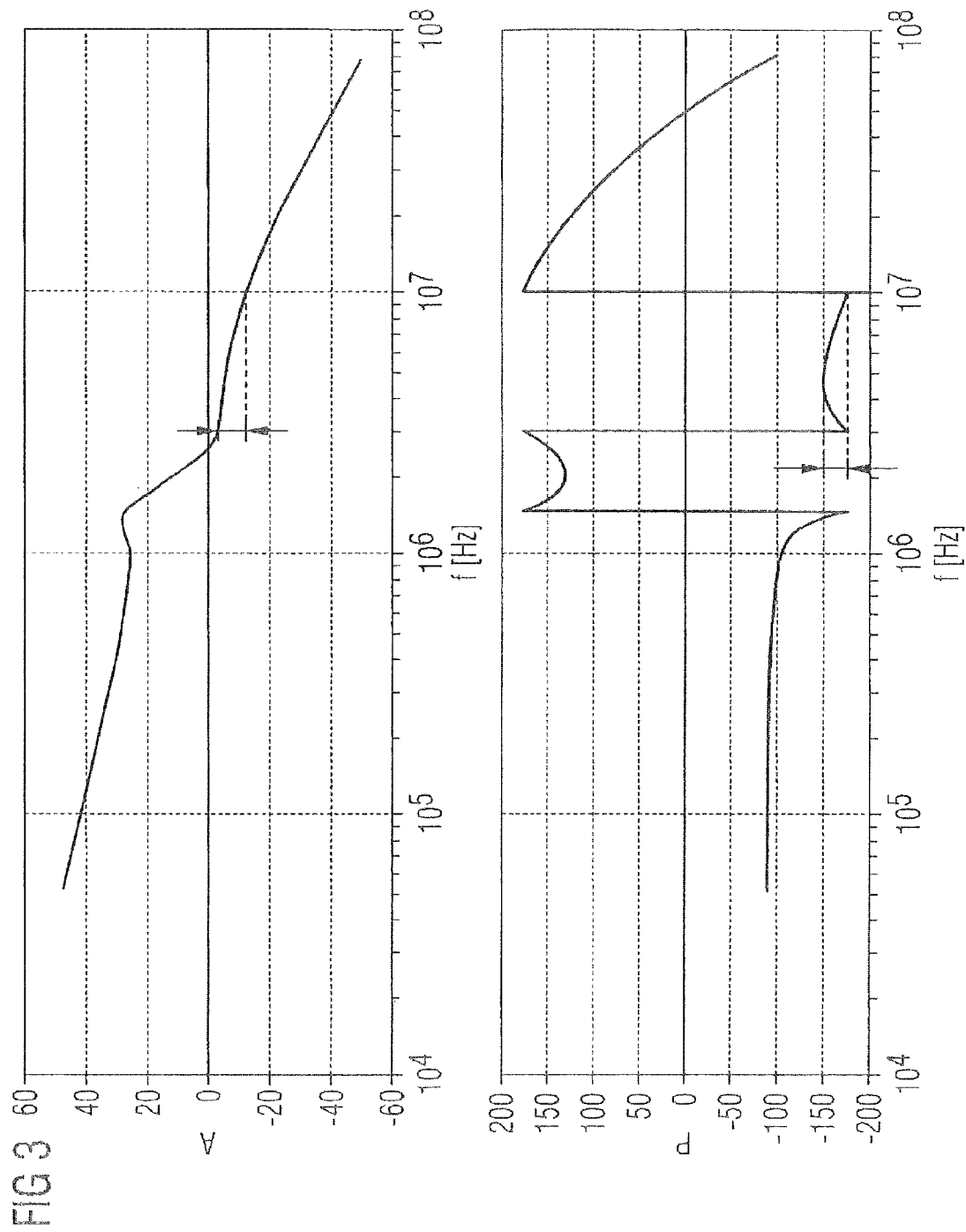
FIG. 3 shows, by way of example, the amplitude transfer function and phase transfer function for an active filter according to the structure of FIG. 2.

FIG. 3 shows, by way of example, the amplitude transfer function A and the phase transfer function P for a filter of the type represented in FIG. 2 as a function of the frequency f. As evident from, in particular, the phase transfer function, the transfer function of the filter shows a plurality of singularities which are manifested as discontinuous step changes of the phase transfer function. An oscillatory state of the driver circuit is thus possible for a plurality of frequencies, but is desired for only one of these frequencies. In FIG. 3, for example, points for a stable oscillatory state are found at a first frequency of approximately $3.10^6$ Hz and at a second frequency of approximately $10^7$ Hz. At these frequencies, the phase transfer function jumps between +180 degrees and −180 degrees and between −180 degrees and +180 degrees, respectively. A phase bandwidth is represented in the lower part of FIG. 3 as the difference between −180 degrees and the local maximum of the phase transfer function between $3.10^6$ Hz and $10^7$ Hz. In the upper part of FIG. 3, an amplitude bandwidth is correspondingly represented as the difference of the amplitude transfer function at the first frequency and at the second frequency.

In particular, if a high frequency is required for the desired oscillatory state, e.g. if the driver circuit is to have a high oversampling ratio, a small phase bandwidth and a small amplitude bandwidth ensue, which means that an oscillatory state at an unwanted frequency is more likely to occur. As already explained, in this case the feedforward filter 10 is reset, such that an oscillatory state at the desired frequency is achieved through a new transient.

Figure 4:
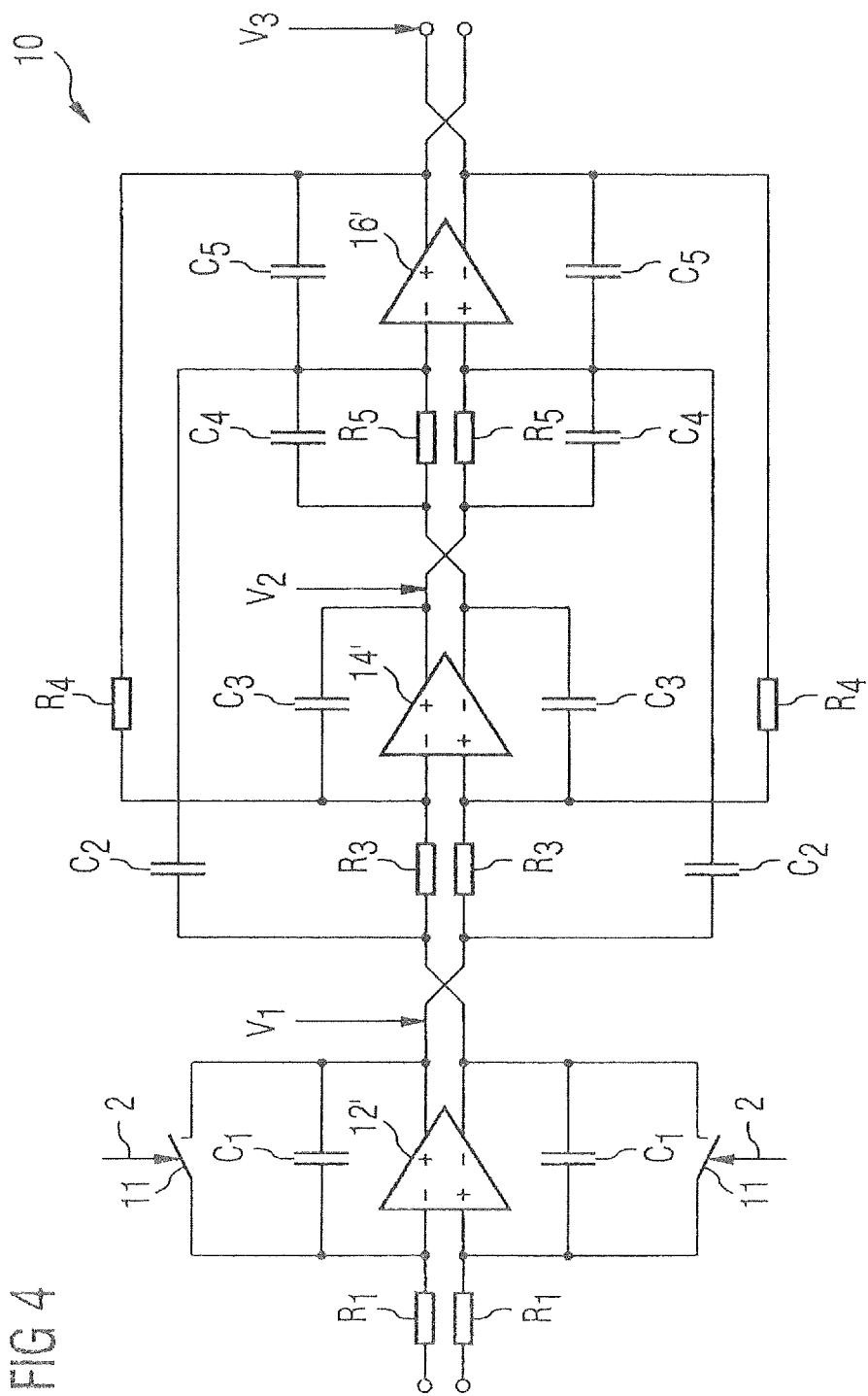
FIG. 4 shows implementation of the active filter in a circuit.

FIG. 4 shows a more detailed implementation of the active filter of FIG. 2 in a differential design. The integrators 12, 14, and 16 comprise a respective operational amplifier 12', 14' and 16', as well as input resistors $R_1$, $R_3$ and $R_5$ respectively and capacitive elements $C_1$, $C_3$ and $C_5$ respectively, there being provided two of said input resistors and capacitive elements, for a positive branch and for a negative branch of the differentially designed filter, respectively. Further capacitive elements $C_2$ and $C_4$ and further resistors $R_4$ serve to implement the feedforward loops 13, 15 and the feedback loop 17.

Represented in FIG. 4, as internal state variables that may be used for the purpose of monitoring, are an output voltage $V_1$ at the output of the first integrator, an output voltage $V_2$ at the output of the second integrator 14, and an output voltage $V_3$ at the output of the third integrator. In the case of the output voltage $V_3$ at the output of the third integrator 16, however, it is to be noted that, because of the summation of the feedforward output signals of the first integrator 12 and of the second integrator 14, as represented in FIG. 2, the output voltage $V_3$ actually represents the sum of the output voltages of the integrators 12, 14 and 16. Likewise, for the output voltage $V_1$, it is to be noted that, because of the feedback loop 17, this output voltage actually represents the difference of the output voltage of the first integrator 12 and of the signal fed back from the output of the filter.

If the integration coefficients $c_1/s$, $c_2/s$ and $C_3/s$ are weighted in such a way that the amplitudes decrease from the input of the filter to the output of the filter, it is advantageous to monitor the output voltage $V_1$ at the output of the first integrator 12 or the output voltage $V_2$ at the output of the second integrator 14. As mentioned above, however, in the case of the represented structure of the filter only the output voltage of the second integrator 14 is available separately, and is used in preference for the purpose of monitoring.

FIG. 4 also shows that the capacitive elements $C_1$ of the first integrator 12 comprise a respective switching means 11 for the positive branch and for the negative branch, said switching means being driven through the control signal 2 generated by the control circuit 18. The switching means 11 can thus be closed by means of the control signal 2, such that the capacitive element $C_1$ is bypassed. Temporary closing of the switching means 11 causes the integrator 12 to be reset, effecting a new transient of the driver circuit.

The control circuit 18 generates the control signal 2 in such a way that the switching means 11 is closed temporarily, the instantaneous oscillatory state of the driver circuit being disrupted sufficiently to effect a new transient. Although this is not represented in FIG. 4, corresponding switching means may also be provided at the capacitive elements $C_3$ and $C_5$ of the second integrator 14 and of the third integrator 16 respectively. Resetting of a plurality of integrators causes a more pronounced disruption of the instantaneously oscillating state, such that the new transient can be achieved with greater reliability or through shorter closing of the switching means 11. Furthermore, it is also not necessary for the switching means 11 to be provided at the integrator at whose output the internal state variable is monitored. Thus, for example, the voltage $V_1$ could be monitored at the output of the first integrator 12, while a switching means at the capacitive element $C_3$ of the second integrator 13 is used to reset the second integrator 14 and, thereby, the filter.

Furthermore, it is understood that the voltages at the outputs of the integrators 12, 14 and 16, that can be used as state variables for the purpose of monitoring, typically oscillate at a particular amplitude. It is therefore advantageous to monitor the oscillation amplitude of the voltage, which varies in a characteristic manner in dependence on the respective oscillatory state of the driver circuit.

It is to be understood, that the above description is intended for illustrative purposes only, and not for limiting the scope of the invention. The illustrated exemplary embodiments are susceptible to various modifications and variations. For example, a different order may be used for the feedforward filter. Also, the feedforward filter may be implemented in a different design. Various internal state variables of the filter may be selected for the purpose of monitoring. Accordingly, the scope of the invention is intended to be limited only by the appended claims.

What is claimed is:

1. A self-oscillating driver circuit, comprising:

a driver stage configured to generate an oscillating output signal based on an input signal;

a feedback path configured to process the oscillating output signal and feed back the processed oscillating output signal for combination with the input signal;

a feedforward path configured to process the combined input signal and processed oscillating output signal to form a processed feedforward signal and provide such processed feedforward signal to the driver stage, the feedforward path comprising an active feedforward filter, wherein the active feedforward filter is configured to be reset if a predetermined condition is satisfied.

2. The driver circuit of claim 1, wherein the predetermined condition comprises a circuit condition of the feedforward filter that is indicative of an oscillatory state of the oscillating output signal at an unwanted frequency.

3. The driver circuit of claim 1, wherein the predetermined condition comprises an internal state variable of the feedforward filter that is indicative of an oscillatory state of the oscillating output signal at an unwanted frequency.

4. The driver circuit of claim 1, wherein the active feedforward filter comprises an integrator circuit having a selectively bypassable capacitance associated therewith, wherein upon the capacitance being bypassed when the predetermined condition is satisfied, the active feedforward filter is reset.

5. The driver circuit of claim 1, wherein the active feedforward filter has a quantity associated therewith, and wherein the quantity assumes a first value when an oscillatory state of the oscillating output signal is at a desired frequency, and assumes a second, greater value when the oscillatory state of the oscillating output signal is at an undesired frequency, and wherein the predetermined condition is satisfied when the quantity exceeds a threshold value that resides between the first and second values.

6. The driver circuit of claim 1, further comprising a control circuit configured to receive a monitoring signal from the active feedforward filter, and output a control signal to selectively reset the active feedforward filter based on the monitoring signal reflecting whether or not the predetermined condition is satisfied.

7. The driver circuit of claim 6, wherein the monitoring signal comprises a node voltage of the active feedforward filter that reflects an internal state variable thereof.

8. A driver circuit, comprising a driver stage having a feedback path and a feedforward path associated therewith, and configured to output an oscillating output signal based on an input signal, wherein the feedforward path comprises a resettable component configured to alter an oscillatory state of the oscillating output signal upon a reset thereof.

9. The driver circuit of claim 8, wherein the resettable component comprises an active feedforward filter configured to be reset in response to a control signal supplied thereto.

10. The driver circuit of claim 9, further comprising a control circuit configured to output the control signal based upon a condition of the active feedforward filter.

11. The driver circuit of claim 10, wherein the condition comprises an internal state variable of the active feedforward filter.

12. The driver circuit of claim 11, wherein the control circuit is configured to output the control signal to reset the active feedforward filter when the internal state variable reflects an oscillatory state of the oscillating output signal at an undesired frequency.

13. The driver circuit of claim 8, wherein the active feedforward filter comprises an integrator circuit having a capacitance associated therewith, and wherein the control circuit is configured to bypass the capacitance with the control signal.

14. The driver circuit of claim 8, wherein the resettable component is reset when a condition of the feedforward path is indicative of an oscillatory state of the oscillating output signal at an unwanted frequency.

15. The driver circuit of claim 8, wherein the feedforward path has a quantity associated therewith, and wherein the quantity assumes a first value when an oscillatory state of the oscillating output signal is at a desired frequency, and assumes a second, greater value when the oscillatory state of the oscillating output signal is at an undesired frequency, and wherein the resettable component is reset when the quantity exceeds a threshold value that resides between the first and second values.

16. A line driver circuit comprising:

a driver stage having a feedforward path comprising an active feedforward filter, and a feedback path associated therewith, wherein the driver circuit is configured to output an oscillating output signal as a function of an input signal; and a monitoring circuit configured to monitor an internal state variable of the feedforward filter, and reset the feedforward filter if the internal state variable of the feedforward filter is outside a predefined range.

17. The line driver circuit of claim 16, wherein the feedforward filter comprises at least one integrator having at least one capacitive component, and a switch driven by the monitoring circuit that is configured to selectively bypass the capacitive component.

18. The line driver circuit of claim 17, wherein the switch is temporarily closed if the internal state variable is outside the predefined range.

19. The line driver circuit of claim 16, wherein the feedback path comprises a passive feedback filter.

20. The line driver circuit of claim 16, wherein the feedforward filter is a third-order filter.

* * * * *